United States Patent [19]

Fujii et al.

[11] Patent Number: 4,774,556
[45] Date of Patent: Sep. 27, 1988

[54] NON-VOLATILE SEMICONDUCTOR MEMORY DEVICE

[75] Inventors: Tetsuo Fujii, Toyohashi; Nobuyoshi Sakakibara, Hekinan; Toshio Sakakibara, Nishio; Hiroshi Iwasaki, Kawanishi, all of Japan

[73] Assignee: Nippondenso Co., Ltd., Kariya, Japan

[21] Appl. No.: 887,625

[22] Filed: Jul. 21, 1986

[30] Foreign Application Priority Data

Jul. 25, 1985 [JP] Japan .................. 60-164781
Aug. 16, 1985 [JP] Japan .................. 180884

[51] Int. Cl.$^4$ .................. H01L 29/78; H01L 29/86
[52] U.S. Cl. .................. 357/23.5; 357/22; 357/23.4; 357/23.14
[58] Field of Search .................. 357/22 D, 23.4, 23.5, 357/23.14, 22 E, 22 G

[56] References Cited

U.S. PATENT DOCUMENTS

| | | | |
|---|---|---|---|
| 4,222,063 | 9/1980 | Rodgers .................. | 357/23.5 |
| 4,317,127 | 2/1982 | Nishizawa .................. | 357/22 D |
| 4,470,059 | 10/1984 | Nishizawa et al. .................. | 357/23.4 |
| 4,542,396 | 9/1985 | Schutten et al. .................. | 357/23.5 |
| 4,623,909 | 11/1986 | Nishizawa et al. .................. | 357/23.4 |

FOREIGN PATENT DOCUMENTS

| | | | |
|---|---|---|---|
| 59-61188 | 4/1984 | Japan .................. | 357/23.5 |
| 60-167376 | 8/1985 | Japan .................. | 357/23.5 |
| 60-173876 | 9/1985 | Japan .................. | 357/23.5 |
| 60-194573 | 10/1985 | Japan .................. | 357/23.5 |
| 8001179 | 3/1981 | PCT Int'l Appl. .................. | 357/23.5 |

OTHER PUBLICATIONS

Tarri et al., "Electrically ... Memory", pp. 369–375, IEEE Jour. of Solid State Circ., vol. SC-7, No. 5, Oct. 72.

Primary Examiner—Andrew J. James
Assistant Examiner—Jerome Jackson
Attorney, Agent, or Firm—Cushman, Darby & Cushman

[57] ABSTRACT

A non-volatile semiconductor memory device comprises a semiconductor substrate of a first conduction type, an impurity buried layer of a second conduction type formed at the surface of the semiconductor substrate for constituting either one of a drain region or a source region, an epitaxial layer of a second conduction type formed at the surface of said impurity buried layer, an insulatiang partition wall extended vertically from the surface of the epitaxial layer surrounding operation regions in the impurity buried layer for defining the operation regions therein, at least one electron holding portion extended vertically with a predetermined distance from the operation regions and disposed within the insulating partition wall apart from the operation region, the impurity buried layer or the drain region by an insulation film of such a thickness as causing a tunnel effect, control gates disposed within the insulation partition wall disposed on every electron holding portions on the side opposite to the operation regions and extended vertically with a certain gap from the electron maintaining portions, and a control gate disposed within the insulating partition wall on every electron holding portions on the opposite side to the operation region extended vertically and with a certain gap to the electron holding portions, and an impurity region of a second conduction type formed at the surface of the operation region for constituting the other of the drain region or the source region.

14 Claims, 13 Drawing Sheets

NON-VOLATILE SEMICONDUCTOR MEMORY DEVICE

BACKGROUND OF THE INVENTION

1. Field of the Invention

This invention relates a non-volatile semiconductor memory device with a reduced area requirement.

2. Description of the Prior Art

Static induction transistors (SIT) have been known as transistors with reduced power consumption and high operation speed. In conventional non-volatile semiconductor memory devices of the MNOS or MONOS types and floating gate types, the source, operation region, drain, electron holding portion, and control gate of the individual memory elements are arranged laterally on the surface of a semiconductor substrate. Accordingly, the area occupied on a semiconductor substrate by a memory device that is formed using this technology is increased. This results in a problem for effecting large scale integration.

SUMMARY OF THE INVENTION

Accordingly, it is an object of this invention to provide a SIT type non-volatile semiconductor memory device with a high degree of integration. This object of this invention is attained by providing an advantageous non-volatile semiconductor memory device of a structure defined within the specification. This semiconductor memory device includes a semiconductor substrate of a first conductivity type. An impurity buried layer is of a second conductivity type which is different from the first conductivity type. This impurity buried layer is formed at the surface of the semiconductor substrate. Furthermore, this impurity buried layer is used to form either a drain or a source of a transistor of the semiconductor memory device.

An epitaxial layer of the second conductivity type is also formed on a surface of the impurity buried layer. An insulating wall extends from a surface of the epitaxial layer to the impurity buried layer and forms an independent vertical channel region coupled to the epitaxial layer. An impurity surface region of the second conductivity type is also formed at a surface of the independent vertical channel region and is used to form the other of the drain and source. That is, the impurity buried layer is used as either the drain or the source of the transistor, while the impurity surface region is used as the other of the drain or source.

The insulating wall is formed with at least two electron accumulating regions formed therein. These electron accumulating regions face the independent vertical channel region. A first insulation film is located between the electron accumulating regions and the insulating walls. This first insulating film is of a specific thickness which causes an induced tunnel effect.

At least two control gate electrodes extend vertically in the insulation wall. A second insulation film is also formed, and the two control gate electrodes separately face each electron accumulating region with the second insulation film therebetween. The control gate electrodes are used to control a conductivity of the independent vertical channel region between the impurity buried layer and the impurity surface region.

As can be seen from the description of this structure, the drain, the independent vertical channel region, the electron accumulating region, the control gate electrode, and the source constitute one memory element. Moreover, all of these elements are disposed vertically of the semiconductor substrate. As such, because all of these devices are disposed vertically, a higher degree of integration can be achieved.

The semiconductor substrate constituting the non-volatile semiconductor memory device according to this invention may be either of the P or N type. The type of the semiconductor substrate is referred to as the first conductivity type in this invention.

An impurity buried layer of a second conductivity type is formed at the surface of the semiconductor substrate. The second conductivity type referred to herein is such a conductivity type that is opposite in type to the first conductivity type. That is, if the first conductivity type is a P type, the second type is an N type.

An epitaxial layer of the second conductivity type is constituted on the impurity buried layer. The thickness of the epitaxial layer is within the range of 2 to 10 $\mu$m, and the impurity concentration thereof ranges from $1 \times 10^{14}$ to $5 \times 10^{14}$ cm$^{-3}$. An operation region is formed on the epitaxial layer. A plurality of operation regions are preferably formed for each one buried layer. The operation region is defined and formed with insulating partition walls made of materials such as oxides, extending substantially vertically from the surface of the epitaxial layer to the buried layer. Therefore, this operation region is an independent vertical channel region. The insulating wall extends from the surface of the epitaxial layer to the impurity buried layer and substantially divides the epitaxial layer into each of the operation regions.

An electron holding portion and a control gate electrode are substantially formed in the insulating wall. When using a floating gate as the electron accumulating region, the floating gate is usually formed of polycrystalline silicon in a plate-like shape extending vertically and separated from the operation region by way of an insulating layer made of an oxide layer or the like of a predetermined thickness (500–1,000 Å).

The insulating portion is made of a material such as oxide and is between the floating gate and the impurity buried layer. This material has a thickness about from 70 to 200 Å to partition these structures with a thickness to cause a tunnel effect. A plurality of floating gates, such as two or four, can be disposed to one operation region. Further, it is necessary that each of the floating gates is arranged side by side vertically.

A control gate electrode is formed in the insulating wall on the side of each of the floating gates opposite the adjacent operation region. The control gate electrode is also formed of polycrystalline silicon.

When the electron accumulating portion is formed at the boundary between the silicon oxide film and the silicon nitride layer, the silicon nitride layer is in a thin film shape, extended vertically from the operation region and apart therefrom. An oxide layer with such a thickness to cause a tunnel effect (as 20–100 Å) is disposed therebetween. The silicon nitride layer may be formed continuously to all of the portions of the oxide partition wall surrounding the operation region.

The control gate electrode is formed in the insulating partition wall at the portion of the silicon nitride layer on the side opposite the adjacent operation region. The control gate electrode is preferably made of polycrystalline silicon. A plurality of control gate electrodes, such as two or four, can be disposed to one operation region. If the respective control gate electrodes are arranged side by side vertically, the most advantageous effects are obtained. Even in the case where a plurality of control gate electrodes are disposed to one operation region, a continuous layer may be used for the silicon nitride layer. It is, however, necessary that the silicon nitride layer is present between each of the control gate electrodes and the operation region. Further, it is preferable to dispose the oxide layer between the control gate electrode and the silicon nitride layer in the same manner as in the ordinary MONOS type. In this case, the thickness of the oxide layer is preferably of about several tens of Å.

An impurity region constituting the other of the source region and the drain region is formed at the surface of the operation region.

Another impurity region is formed on the surface of the epitaxial layer, at a portion other than the operation region, in order to ensure electroconductivity between the impurity buried layer and the surface of the substrate. The impurity region and the operation region are electrically insulated from other portions of the semiconductor substrate with an isolation of the first conductivity type. The surface of the epitaxial layer and each of the impurity regions are covered with an oxide layer, and an aluminum electrode is formed on the portion passing through the oxide layer. It is also preferable to form an insulation film with a relatively thin thickness, thin enough to cause a tunnel effect between the electrode constituting either the drain or the source, and the impurity region adjacent the electrode. The tunnel effect insulating film constitutes a half-impedance and eliminates the leak current upon cutoff between the source and the drain.

Although $SiO_2$ film is generally used for the insulating film, $Al_2O_3$ or $Si_3N_4$ film or a composite film thereof may also be used.

In the non-volatile semiconductor memory device according to this invention, either one of the impurity buried layer and the impurity region formed on the operation region can be used as the source, with the other being used as the drain. Upon writing into the electron accumulating portion, a positive voltage is applied to a control gate electrode which is adjacent the intended electron accumulating portion. The other of the source and the drain is grounded. A tunnel current flows from the impurity buried layer or the operation region by way of the tunnel insulating film to the electron accumulating region to accumulate electrons in this electron accumulating region. Since the electron accumulating region is entirely surrounded with the insulating film, the electrons in the electron accumulating region do not escape, but rather are held therein. That is, non-volatility can be attained.

To erase the state of the electron accumulating region, a low potential is applied only to the control gate electrode that is adjacent the electron accumulating region intended to be erased. Simultaneously, a high potential is applied to the other control gate electrode, source and drain. This causes electrons to flow from the electron accumulating region adjacent the control gate electrode, and a low potential, by way of the tunnel insulating film, to the impurity buried layer or the operation region. Thus, erasing the electron accumulating region can be conducted easily. For erasing all of the electron accumulating regions, a low potential can be applied to all of the control gate electrodes, and a high potential is applied to all of the sources and the drains. Electrons are then issued from all of the electron accumulating regions, thereby erasing all of these electron accumulating regions.

When electrons are accumulated or written in the electron accumulating region, a depletion layer is formed in the adjacent operation region due to the electrostatic induction of the electron accumulating region. This increases the resistance of the operation region and increases the electrical resistance for the current flowing from the source of the drain. When no writing is performed for the electron accumulating region, no depletion layer is formed to the operation region. Accordingly, the electrical resistance between the source and the drain is low. Due to the difference in resistance, two signals can be taken out relative to one electron accumulating region.

BRIEF DESCRIPTION OF THE ACCOMPANYING DRAWINGS

These and other objects, as well as features of this invention will be clarified with reference to the following descriptions for preferred embodiments according to this invention while referring to the appended drawings, wherein FIGS. 1 and 2 show a non-volatile semiconductor memory device as one embodiment according to this invention, in which FIG. 1 is a vertical cross-sectional view for a portion thereof and FIG. 2 is a cross-sectional view taken along line A—A in FIG. 1;

FIGS. 3 through 9 are cross-sectional views showing portions of the device for main steps when preparing the non-volatile semiconductor memory device of the first embodiment, in which FIG. 3 is a cross-sectional view when the epitaxial layer is formed, FIG. 4 is a cross-sectional view when the oxide layer is formed, FIG. 5 is a cross-sectional view in which grooves are formed for forming the floating gates, FIG. 6 is a cross-sectional view when the oxide film and the tunnel oxide film are formed to the grooves, FIG. 7 is a cross-sectional view showing the state where the polycrystalline silicon is embedded, FIG. 8 is a cross-sectional view when the second grooves are formed for forming the control gates, and FIG. 9 is a cross-sectional view showing the state of burying he polycrystalline silicon into the second grooves;

FIGS. 10 through 12 show the operation state of the non-volatile semiconductor memory device as the first embodiment according to this invention, in which FIG. 10 shows a cross-sectional view illustrating the wirings upon writing, FIG. 11 is a cross-sectional view showing the state of wirings upon detection, and FIG. 12 is a cross-sectional view showing the state of wiring upon erasing;

FIGS. 15 and 16 show the non-volatile semiconductor memory device as the third embodiment according to this invention, in which FIG. 15 is a longitudinal cross-sectional view for a portion thereof and FIG. 16 is a cross-sectional view taken along line A—A in FIG. 15;

Figure 5:
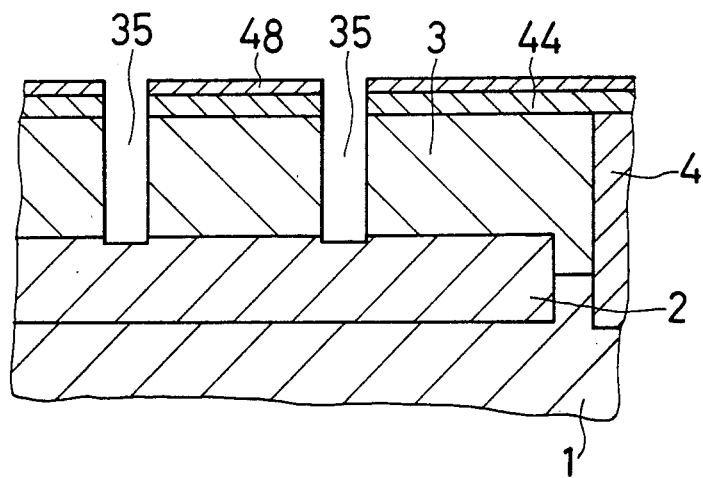
Figure 17:
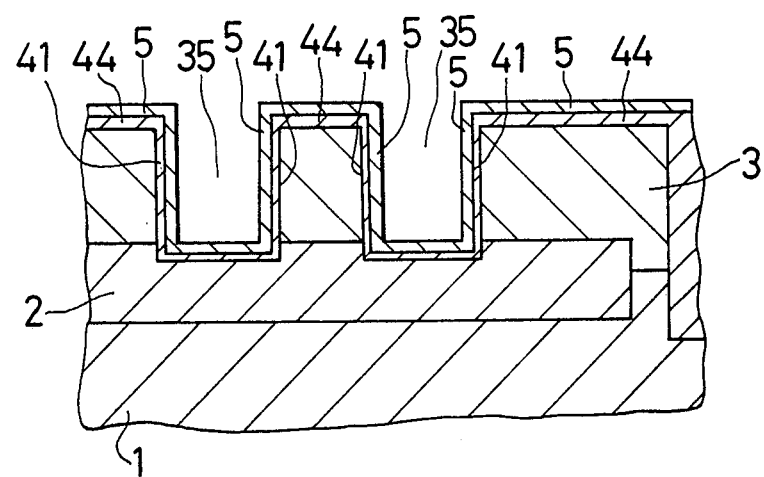
Figure 18:
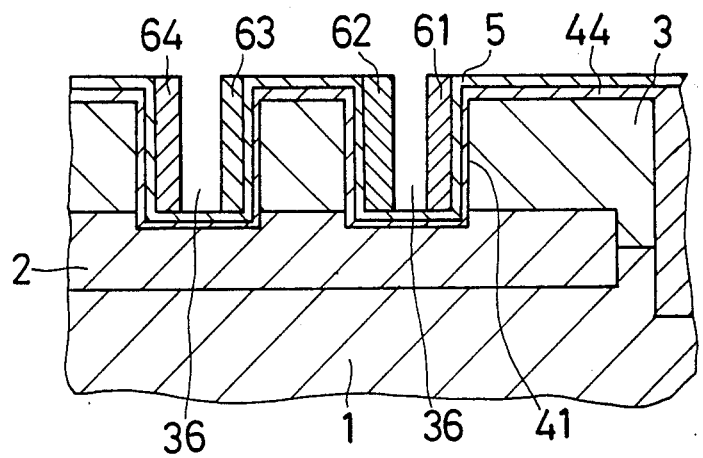
Figure 19:
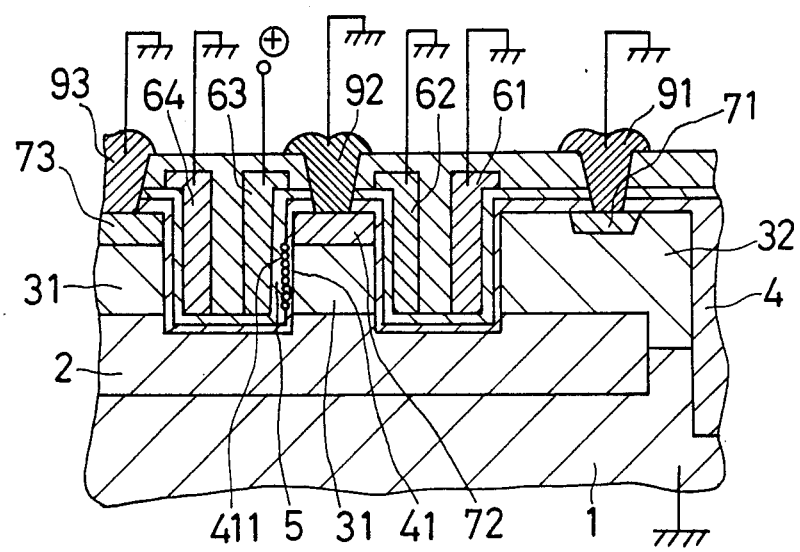
Figure 20:
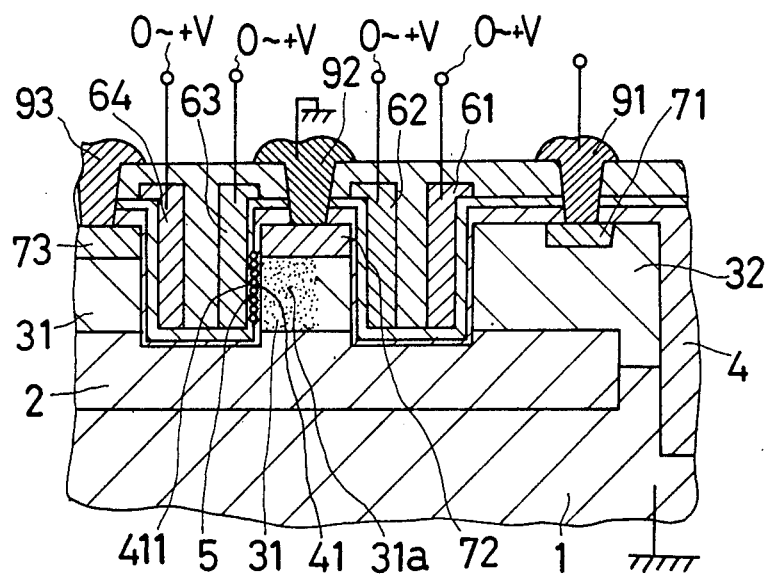
Figure 21:
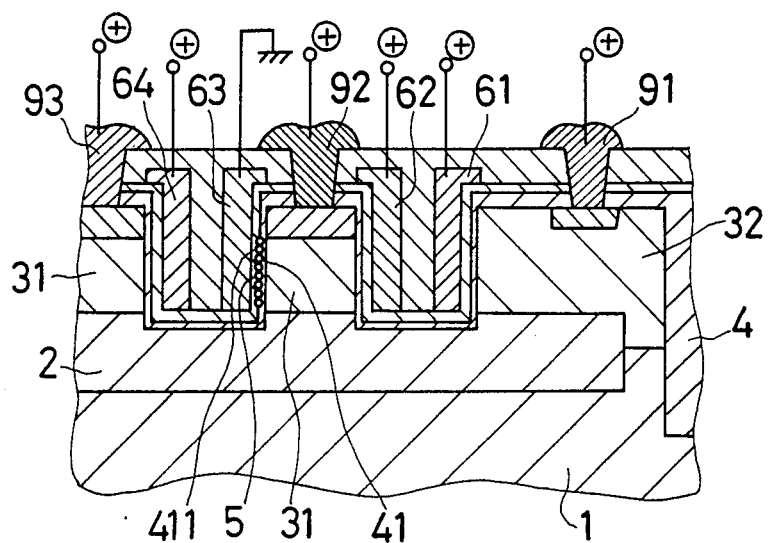
Figure 22:
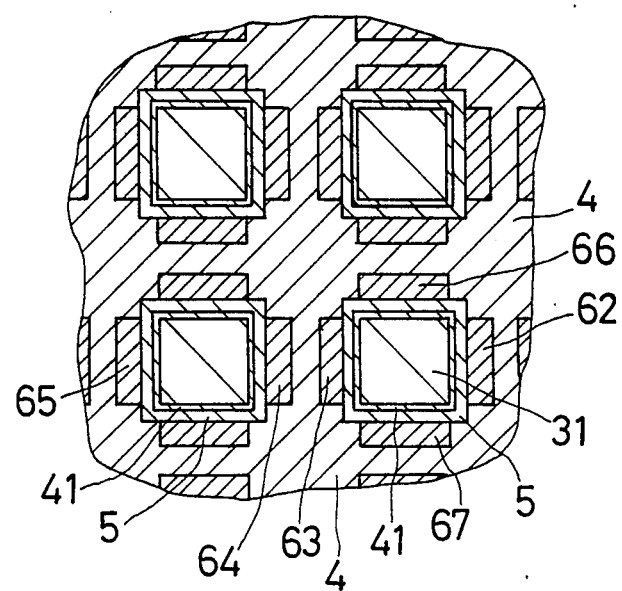
Figure 23:
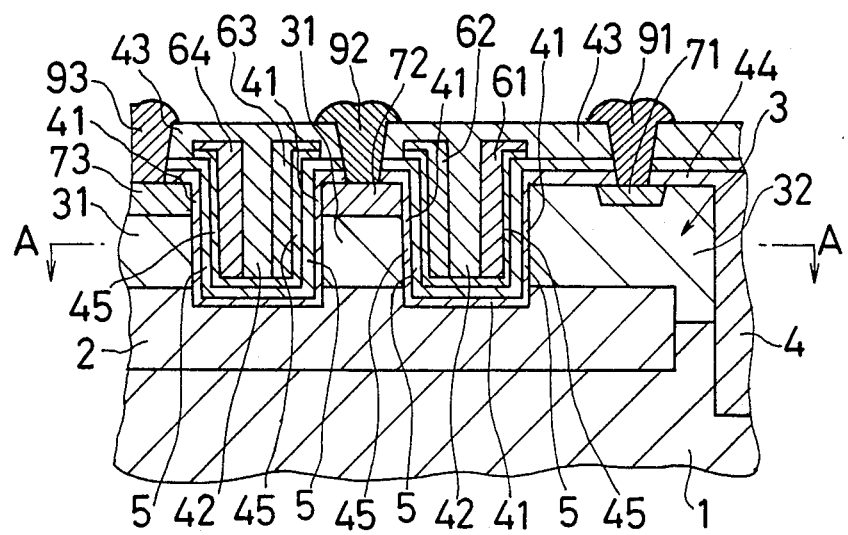
Figure 24:
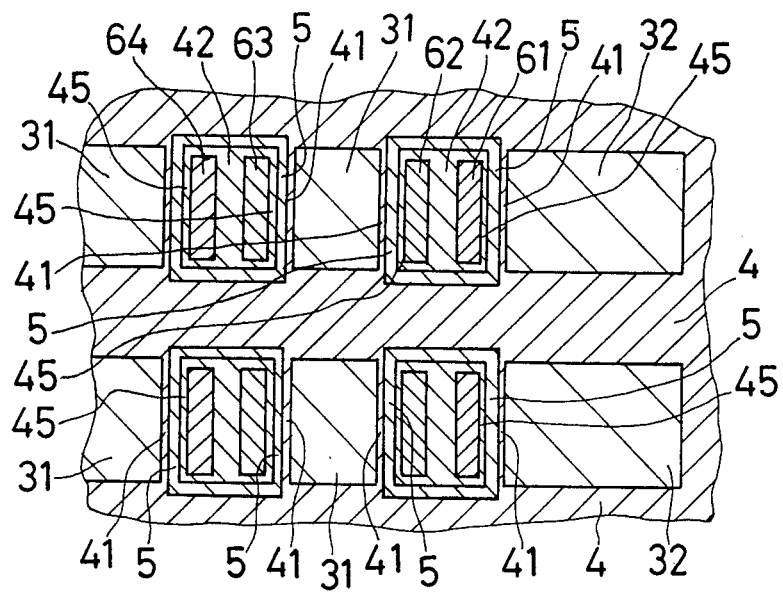

FIGS. 17 and 18 are cross-sectional views showing the portion on every main step for producing the non-volatile semiconductor memory device as the third embodiment, in which FIG. 17 is a cross-sectional view in which the tunnel oxide film and the silicon nitride film are formed to the grooves in FIG. 5, while FIG. 18 is a cross-sectional view, in which second grooves are formed for forming the control gates;

FIGS. 19 through 21 show the operation state of the non-volatile semiconductor memory device according to Example 3, in which FIG. 19 is a cross-sectional view showing the wirings upon writing, FIG. 20 is a cross-sectional view showing the state of wirings upon detection, and FIG. 21 is a cross-sectional view showing the wiring state upon erasing;

FIG. 22 shows a portion of a further embodiment modified from Example 3 and which shows the transversal cross-sectional view of the operation region;

FIGS. 23 and 24 show the non-volatile semiconductor memory device of the fourth embodiment wherein FIG. 23 is a vertical cross-sectional view of the fourth embodiment and FIG. 24 represents a cross-sectional view taken along line A—A in FIG. 23.

DESCRIPTION OF THE PREFERRED EMBODIMENTS

Example 1

Figure 1:
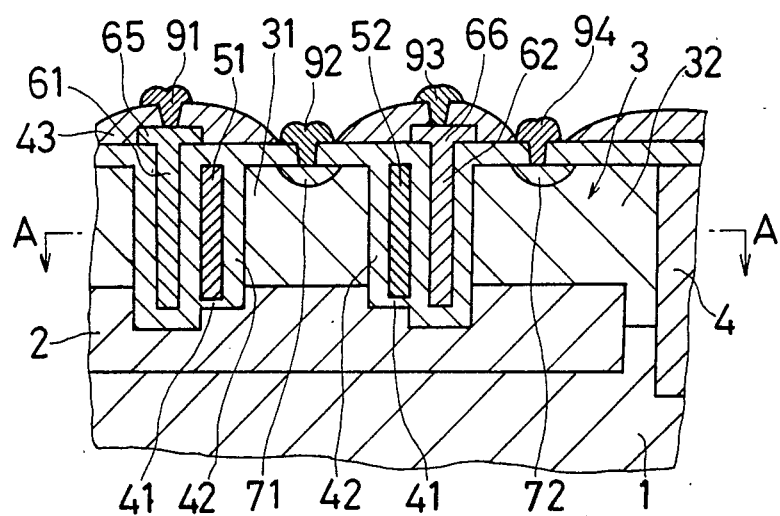
Figure 2:
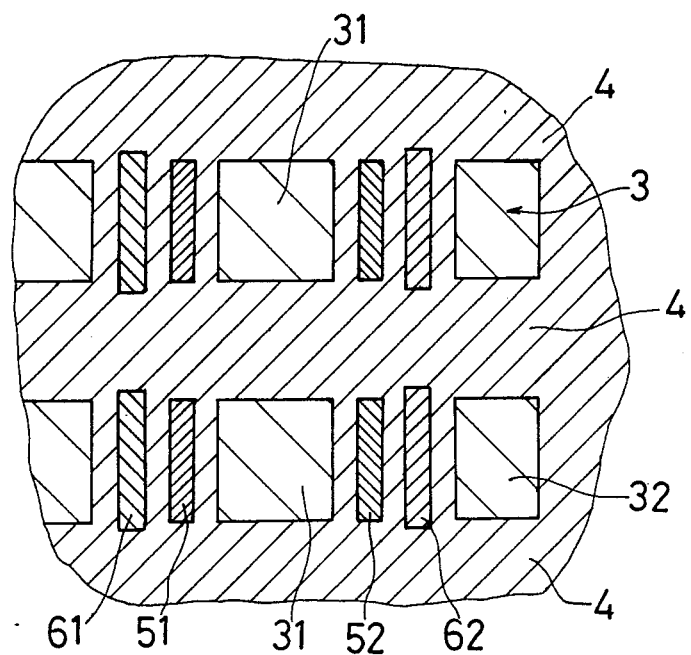

FIGS. 1 and 2 show a cross section of a portion of a non-volatile semiconductor device of the first embodiment according to this invention. FIG. 1 is a vertical cross-sectional view while FIG. 2 is a cross-sectional view taken along line A—A in FIG. 1. The device comprises P type silicon substrate 1, and N type impurity buried layer 2 formed within a predetermined area of the silicon substrate 1. An N type epitaxial layer 3 is formed on a surface of substrate 1. An oxide layer 4 separates regions of the epitaxial layer 3 into separate operation regions 31. A conduction region 32 is formed on the inside of the oxide layer 4 and has the purpose of ensuring electroconductivity between the impurity buried layer 2 and the surface of the epitaxial layer 3. Floating gates 51, 52 are formed opposite each other in the oxide layer 4 at the periphery of operation region 31. Oxide film 42 is disposed between floating gates 51, 52 and operating region 31. Further control gate electrodes 61, 62 are disposed on the outer side of each of the floating gates 51, 52 by way of a thermally oxidized film, respectively. The floating gates 51, 52 are separated from impurity buried layer 2 by a thin tunnel oxide film 41. N type impurity regions 71, 72 are formed at the upper surface of the electroconductive region 32. The control gates 61, 62 are connected to wiring patterns 65, 66 and covered with interlayer insulation films 43 formed at the surface thereof. The control gates 61, 62 and the impurity regions 71, 72 are connected by way of contact holes disposed to the oxide layer to the electrodes 91, 92, 93, 94.

Figure 3:
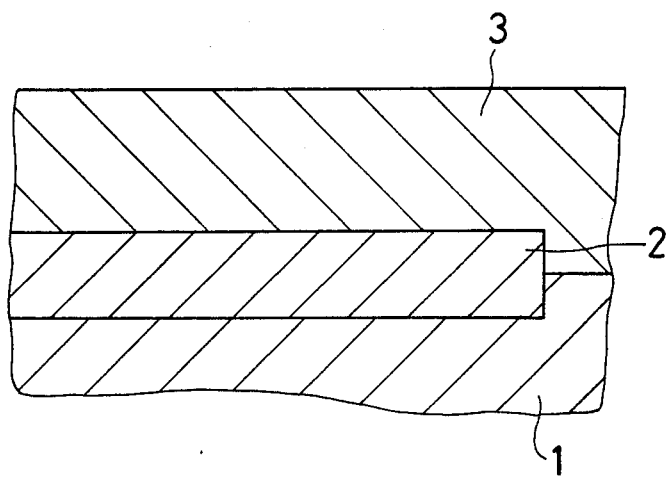
Figure 4:
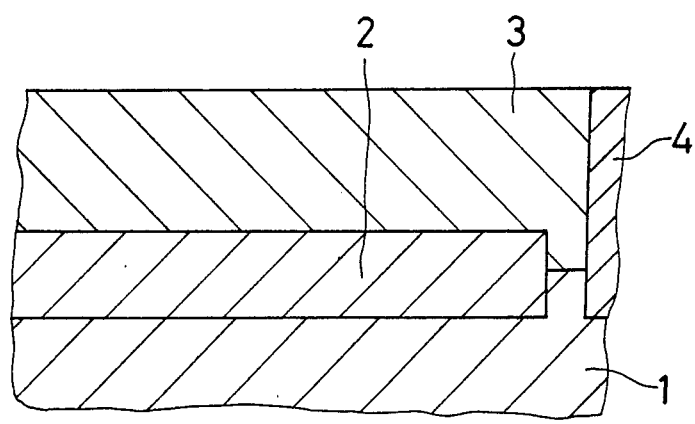

Now an explanation will be made of the method of manufacturing the non-volatile semiconductor memory device of this embodiment with reference to FIGS. 3-9. Initially, a group V element of the periodical table (e.g. As or P) is diffused into a P type silicon substrate 1 (6–8 ohm.cm) to form an N type impurity buried layer 2 in a predetermined region, as shown in FIG. 3. Then, an N type epitaxial layer, at a concentration from $1 \times 10^{14}$ cm$^{-3}$ to $5 \times 10^{14}$ cm$^{-3}$, is grown to a thickness of between 2 to 10 $\mu$m. Then, to electrically separate each of the regions, after forming the groove in the silicon substrate 1 and the epitaxial layer 3, SiO$_2$ isolation is carried out by a CVD process to form an oxide layer 4, as shown in FIG. 4. As shown in FIG. 5, a thermally oxidized film, (SiO$_2$) 44, is subsequently formed to a thickness of from 0.8 to 1.0 $\mu$m on the surface of the epitaxial layer 3 by oxidization under a steam atmosphere at 1,000° C. Resist pattern 48 is formed on a region where the groove 35 is to be formed by conventional photolithography or etching means. The thermally oxidized film 44 is partially etched through anisotropic etching such as by reactive ion etching, ion milling or reactive ion milling, while using the resist pattern 48 as a mask. Then, the epitaxial layer 3 is subjected to selective anisotropic etching and grooves 35 are formed by continuing the etching until its downward extreme arrives at the impurity buried layer 2. The situation is shown by the cross section of FIG. 5.

The resist pattern 48 is removed and the inside of the groove 35 is thermally oxidized under dry oxygen at a temperature from 1,000° C. to 1,050° C. to oxidize the inner wall surface and the bottom surface of the groove 35 to 500–1,000 Å, followed by a removal of the thermally oxidized film. Because of the oxidation and the subsequent removal, any contaminations caused by the reactive ion etching and the roughened etching surface are removed and an improvement in the withstanding voltage of the insulation and heat stability of the thermally oxidized film is obtained.

After removing the thermally oxidized films as described above, oxidization is again conducted under dry oxygen at a temperature from 1,000° C. to 1,050° C. to form a thermally oxidized film 42 on the inner wall surface, of a thickness from 500 to 1,000 Å and on the side of the groove 35. The independent vertical channel region, or region, 31, is thus defined.

Figure 6:
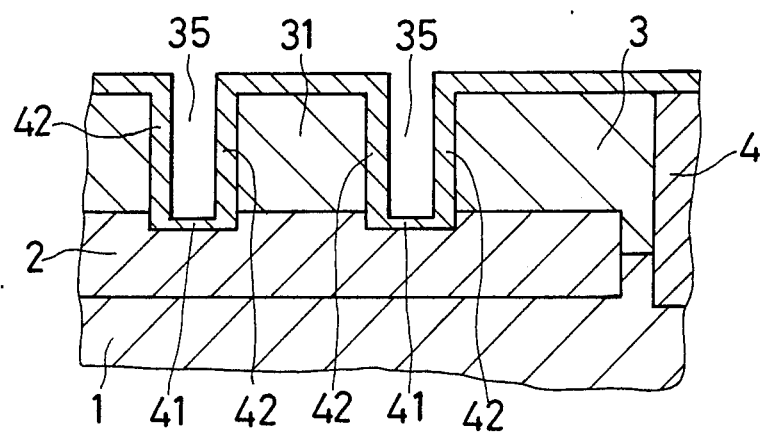

Only the oxidized film portion at the bottom of the groove 35 is then removed by anisotropic etching through the reactive ion etching. The bottom of the impurity buried layer 2 exposed to the silicon surface is successively oxidized under dry oxygen diluted with argon gas to form a tunnel oxidized film 41 of 70 to 200 Å as shown in FIG. 6.

Figure 7:
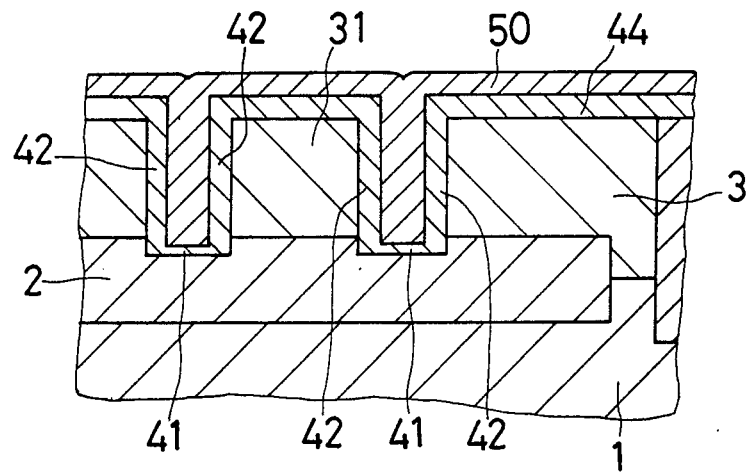

Then, an N$^+$ type polycrystalline silicon layer 50 with a large concentration of arsenic or phosphor is deposited to entirely fill the groove 35, formed with the oxidized film 42 and the tunnel oxidized film 41, by means of an LP CVD process. This is shown in FIG. 7.

Figure 8:
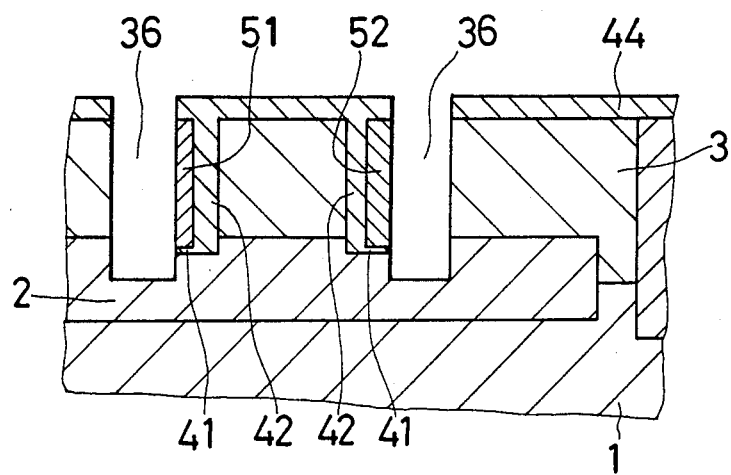

The polycrystalline silicon layer 50 formed on the entire surface is etched using an etch-back process until the surface of the thermally oxidized film 44, previously formed on the surface by reactive ion etching or the like, is exposed. The polycrystalline silicon layer 50 and the epitaxial layer 3 are successively etched in the same manner as this method of forming the groove 35, to thereby form a second groove 36. In this case, floating gates 51, 52 are formed as shown in FIG. 8.

Figure 9:
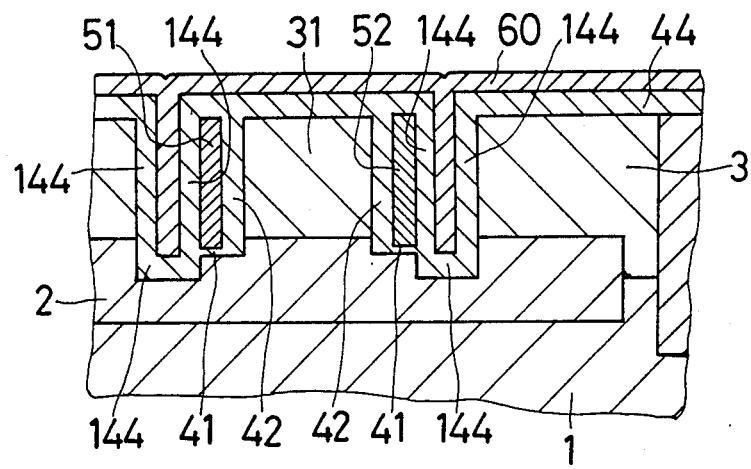

Then, as shown in FIG. 9, thermally oxidized films 144 are formed to the bottom and the wall surfaces of the second groove 36 to a thickness of between 500 to 1,000 Å using the re-oxidization method as described above. An N type second polycrystalline silicon layer 60 is subsequently formed. The second polycrystalline silicon layer 60 is then partially removed by etching to form control gates 61, 62 and wiring patterns 65, 66 (shown in FIG. 1). An interlayer insulation film 43 is then deposited and, thereafter, a contact hole for attaining electrical connection is formed, through which impurities are formed to a predetermined region by ion injection for forming N+ impurity regions 71, 72 (or P+ impurity regions (not illustrated)).

A vapor deposited aluminum layer of the type conventionally used is then formed to the portion of the contact hole to form electrodes 91, 92, 93, 94 including wiring layers by means of photolithography or etching. In this way, the non-volatile semiconductor memory device of this embodiment shown in FIG. 1 is prepared.

The N+ impurity regions (or P+ impurity regions) 71, 72 may also be formed by forming the polycrystalline silicon layer 50 in the etched-back state in FIG. 7. Further, it is also possible to eliminate the oxidized films at the surface, to smooth the surface by a so-called selective oxidization process (LOCOS) before the formation of the second groove 36. A so-called ordinary MOS transistor, not shown in the present embodiment, can also be formed on the epitaxial layer region 3 and P type isolation (not illustrated). In this case, the P type isolation may be formed at the concentration of P well. The silicon gate of the usual MOS transistor can be formed with the second polycrystalline silicon layer 60. Further, the N+ impurity regions 71, 72, etc., in this embodiment can be formed, for example, with an N+ impurity region or a P+ impurity region for forming the source and the drain of the usual MOS transistor.

The operation of this embodiment will be described referring to the Example of FIG. 10.

Figure 10:
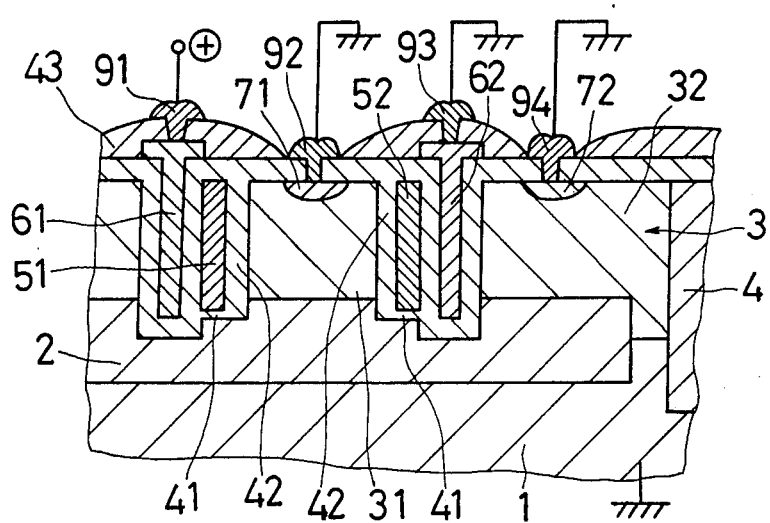

FIG. 10 shows an example wiring configuration with a positive (+) voltage applied to the electrode 91 of the control gate 61 which is capacitively coupled to the floating gate 51. In this example, floating gate 51 is the gate to be written. All of the other electrodes 92, 93 and 94 are grounded. A tunnel current flows through the tunnel oxidized film 41 formed between the floating gate 51 and the impurity buried layer 2, and electrons accumulate in the floating gate 51. As a result, a depletion layer 31a (shown in FIG. 11) extends to the operation region 31 due to the electronic charges in the floating gate 51, even if no voltage is applied to the control gate 61. The amount of extension of the depletion layer 31a is determined by the amount of electrons in the floating gate 51. When a large number of electrons are written, the extension of the depletion layer 51a takes a predetermined value. This is width of the depletion layer in which a so-called inversion layer is formed in a MOS diode, and the width Xd—max is represented by the following equation.

$$Xd-max=$$

In this embodiment, Nd represents the concentration in the epitaxial layer 3 (for instance, Xd—max=2.7 μm at the concentration of the epitaxial layer 3 of $1\times10^{14}$ cm$^{-3}$, while Xd— max=1.0 μm for that of $1\times10^{15}$ cm$^{-3}$).

Figure 11:
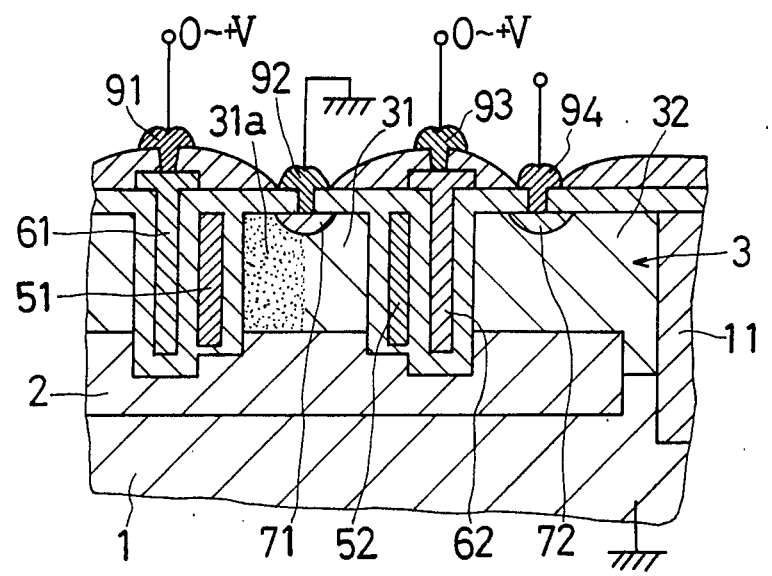

As in the case of this embodiment using two opposing EEPROMs and an epitaxial layer at a concentration of $1\times10^{14}$ cm$^{-3}$, if the distance between the floating gates 51 and 52 in the control region 31 is, for example, 4 μm, depletion layers from both of the two floating gates 51, 52 are in contact with each other during a time of writing of electrons. Due to this, impurity buried layer 2 and impurity region 71 formed to the contact portion are cut off from one another, terminating current flow. FIG. 11 shows the state where electrons are written only to one floating gate 51. Current does flow in this state.

Figure 12:
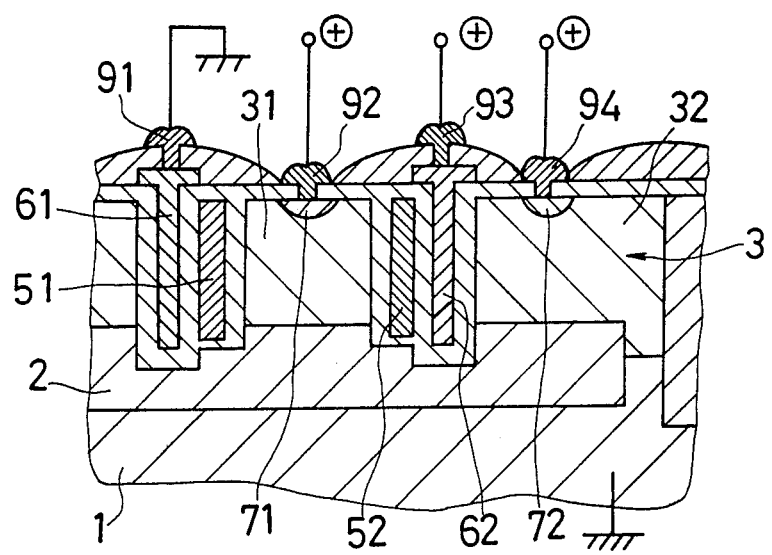

Explanation will now be made of the erasing of the EEPROM in this embodiment. FIG. 12 shows the state of erasing the floating gate 51. The potential of the electrode 91 of the control gate 61 is kept, for example, at 0 V. This electrode is capacitively coupled to the control gate 51 to be erased. A higher potential is applied to other electrodes 92, 93, 94. Thus, electrons flow from the floating gate 51 to the impurity buried layer 2 as a tunnel current and are thus erased.

In the non-volatile semiconductor memory device in this embodiment, two floating gates 51, 52 are disposed to one operation region 31. Accordingly, four memory conditions can be obtained. A first case has none of the floating gates 51, 52 of the operation region 31 being written (0, 0). In a second case, only one operation gate 51 is written (1, 0). Another case has only the other floating gate 52 being written (0, 1) and a final case has both of the two floating gates 51, 52 written (1, 1).

The state of the memory can be detected by applying a voltage to the capacitively-coupled control gate. Based on the change in the resistance between the source and the drain, the state can be detected. For instance, if the floating gate 51 is being written, the change in the resistance between the source and the drain is small, even if a voltage is applied to the control gate 61 in capacitive coupling with the floating gate 51. On the other hand, if the floating gate 51 is not written, the resistance between the source and the drain increases significantly if a voltage is applied to the control gate 61. In this way, the condition floating gate 51 can be detected, enabling its use as a memory device.

Figure 13:
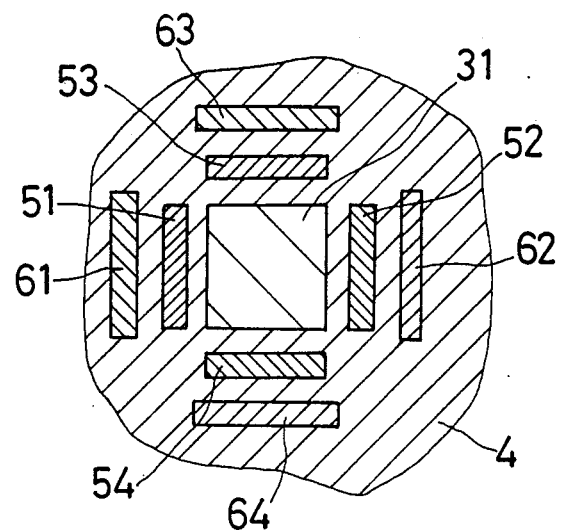
FIG. 13 shows a portion of another embodiment modified from the first embodiment, which is a transversal cross-sectional view of the operation region.

In the first embodiment of this invention, two floating gates are disposed to one control region. The number of floating gates may be optional depending on the case. For example, four floating gates 51, 52, 53, 54 may be disposed to one operation region 31, as shown in FIG. 13. In this case, each one of floating gates 61, 62, 63, 64 is required for capacitive coupling with each of the floating gates. FIG. 13 is a cross-sectional view corresponding to FIG. 2 for the first embodiment, which shows a portion at the central transversal cross-sectional view of an operation region in the non-volatile semiconductor memory device.

Example 2

Figure 14:
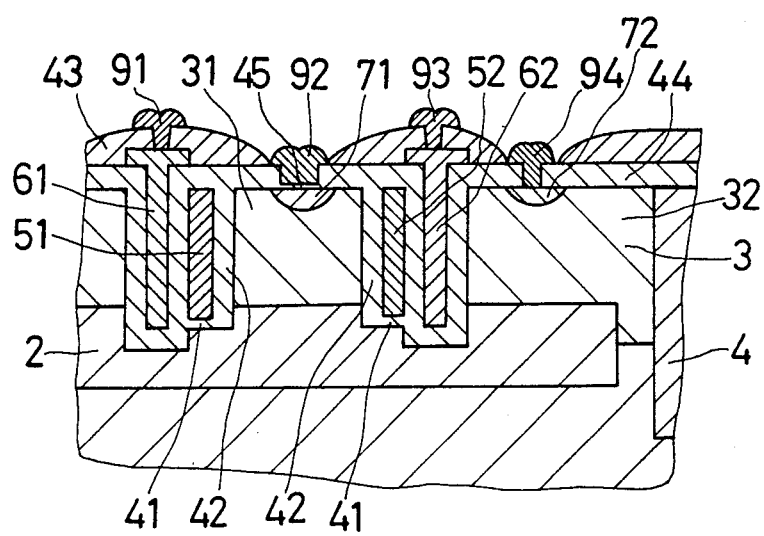
FIG. 14 is a longitudinal cross-sectional view for a portion showing the non-volatile semiconductor memory device in the second embodiment.

FIG. 14 shows a vertical cross-sectional view for a portion of a non-volatile semiconductor memory device of the second embodiment according to this invention. The non-volatile semiconductor memory device in this embodiment has a substantially identical structure with that of the non-volatile semiconductor memory device of the first embodiment, except that a tunnel oxidized film 45 is disposed between the impurity region 71 of the operation region 31 and an electrode 92. The same portions of the second embodiment as those in the first embodiment have identical reference numerals. The tunnel oxidized film 45 is formed by forming the impurity regions 71, 72 and, thereafter, selectively oxidizing only the surface of the impurity region 71 of the operation region 31 prior to the formation of electrodes 91, 92, 93, 94. Since the tunnel oxidized film 45 has a predetermined voltage withstanding insulation, it provides a completely insulated state when the depletion layer is extended between the source and the drain. However, a current flows in the tunnel oxidized film 45 if there is no depletion layer. Therefore, there is no problem regarding the intended object for ON-OFF detection between the source and the drain. Since there is no leak current upon OFF detection, the detection accuracy in the OFF state can be improved.

Example 3

Figure 15:
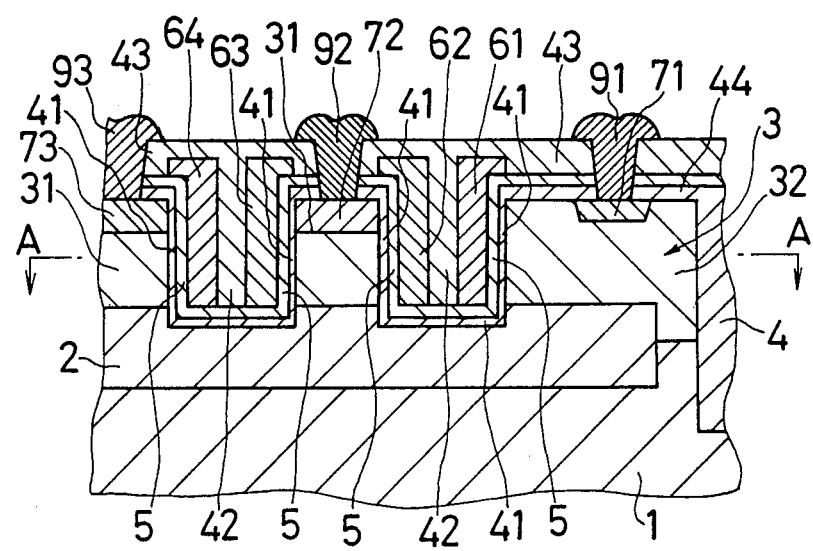
Figure 16:
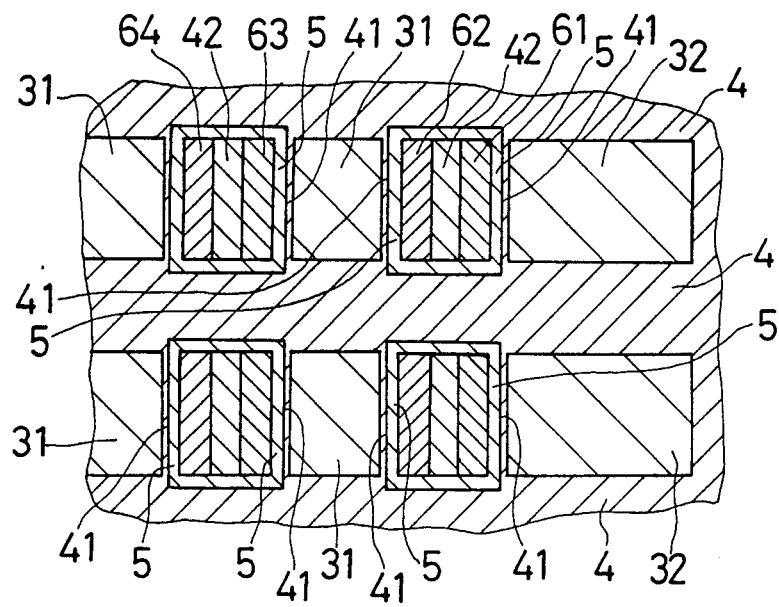

FIG. 15 and 16 show cross-sectional views for a portion of the non-volatile semiconductor memory device as the third embodiment according to this invention. FIG. 15 is a vertical cross-sectional view and FIG. 16 is a cross-sectional view taken along line A=A in FIG. 15. The device comprises a P type silicon substrate 1, an N type impurity buried layer 2 formed within a predetermined range of the silicon substrate 1, an N type epitaxial layer 3 formed at the surface thereof, and an oxide layer 4. Further, a silicon nitride layer 5 is formed to the tunnel oxidized film 41. Each of the control gates 61, 62, 63, 64 is disposed in the vertically extended portion of the silicon nitride layer 5 in contact with the surface opposite each of the operation regions 31 and the conduction regions 32. The control gates 61, 62, 63, 64 are respectively connected to a wiring pattern and covered with a protecting insulation film 43 formed at the surface thereof. The impurity regions 71, 72, 73 are wired through the contact hole formed to the protecting insulation film 43, silicon nitride layer 5 and the thermally oxidized film 44 to the electrodes 91, 92, 93.

An explanation will now be made of the method of manufacturing the non-volatile semiconductor memory device of this embodiment referring to FIGS. 17 and 18. As shown in FIG. 5, the method is identical with that in Example 1 from the formation of the groove for forming the electron maintaining portion to the step of removing the roughness at the etched surface by resist pattern 48 and eliminating the oxidizing and eliminating the inside of the groove 35. Successively, the side of the epitaxial layer 3 and the upper surface of the impurity buried layer 2 in the groove 35 exposed with the silicon surface is oxidized under dry oxygen diluted with argon gas to form a so-called tunnel oxidized film 41 of 20 to 100 Å. Successively, a silicon nitride film 5 is formed over the entire surface to a thickness of 500 to 1,000 Å through a hot CVD process at about 800° C. while using silicon chloride (SiCl4) or silane (SiH4) and ammonia (NH3) as the source and using a mixture of nitrogen and hydrogen as a carrier gas. FIG. 17 shows this state.

Then, N+ type polycrystalline silicon layer containing a large amount of arsenic or phosphor is deposited on the entire surface by an LP CVD process to fill the groove 35 formed with the tunnel oxidized film 41 and the silicon nitride film 5.

Then, the polycrystalline silicon layer at the upper surface is eliminated by an etch-back method until the surface of the thermally oxidized film 44 formed to the surface by means of reactive ion etching or the like is partially exposed, forming a wiring pattern. Successively, the polycrystalline silicon layer is etched to form a second groove 36 in the same manner as the method for forming the groove 35. In this case, control gates 61, 62, 63, 64 are formed. FIG. 18 shows this state.

An oxide layer 42 is deposited on the second groove 36 and a protecting insulation film 43 is deposited. Then, a contact hole is formed for attaining electrical connection, through which impurities are formed by ion injection into a predetermined region. In this way N type regions 71, 72, 73 are formed.

Then, a vapor deposited aluminum layer employed usually is formed to the portion of the contact hole to form electrodes 91, 92, 93 including the wiring layer by photolithography or etching. In this way, the non-volatile semiconductor memory device of this embodiment shown in FIG. 15 can be easily manufactured.

The N impurity regions 71, 72, 73 can also be formed in the state of etching back the polycrystalline silicon layer 50 (not illustrated) in FIG. 18. The oxidized film 4 of the silicon nitride film 5 can also be eliminated at the surface before the formation of the second groove 36 to render the surface smooth by a so-called sensitive oxidation process (LOCOS process). A usual type MOS transistor (not illustrated) can also be formed in this embodiment to the epitaxial layer region 3 and the P type isolation (not illustrated). In this case, the P type isolation may be formed with the concentration of the well.

The device as constituted above is used as a so-called EEPROM.

FIG. 19 shows an example to be used in explaining the operation of this embodiment. FIG. 19 shows the writing operation, in which a positive (+) voltage is applied to the control gate 63, which is capacitively coupled with the portion of the silicon nitride layer 5 to be written. All of other control gates 61, 62, 63, 64 and all of the electrodes 91, 92, 93 are grounded. Thus, a tunnel current flows through the tunnel oxidized film 41 between the control gate 63 and the operation region 31. Electrons are accumulated at the portion between the tunnel oxidized film 41 and the silicon nitride layer 5 to form an electron trap layer 411. As a result, a depletion layer 31a extends to the operation region 31 as shown in FIG. 20 due to the electron charges in the electron trap layer 411 even if the voltage is not applied to the control gate 63. FIG. 20 shows the state in which the electron trap layer 411 is formed only at the portion of the silicon nitride layer 5 in capacitive coupling with one control gate 63 while electrons are being written. In this state, current flows while the resistance of the operation region 31 is increased.

An explanation of erasing the EEPROM in this embodiment is given herein. FIG. 21 shows the state of erasing the electron trap layer 411. That is, a low potential, for example, 0 volts, is applied only to the control gate 63 to be erased, while a higher potential is applied to the control gates 61, 62, 64 and all of other electrodes 91, 92, 93. Thus, electrons flow from the electron trap layer 411 to the operation region 31 as the tunnel current and are thus eliminated.

In the non-volatile semiconductor memory device according to this embodiment, two control gates 62, 63 are disposed to one operation region 31 and the silicon nitride layer 5 is disposed corresponding to each of the control gates apart from the operation region by the tunnel oxidized film 41. Thus, four memory states can be attained, as in the above case; that is, the case where none of the portion of the silicon nitride layer 5 for the control gates 62 and 63 of one operation 31 is written (0, 0), the case where the electron trap layer is formed and electrons are written to the portion of the silicon nitride layer 5 only for one control gate 62 (1, 0), the case where the electron trap layer is formed and electrons are written to the portion of the silicon nitride layer 5 only for the other control gate 63 (0, 1) and the case where the electron trap layer is formed and electrons are written to the portion of the silicon nitride layer 5 for both of the two control gates 62, 63 (1, 1).

The memory state can be detected by applying a voltage to the capacitively-coupled control gate. Based on the change in the resistance between the source and the drain, the memory state is detected. For instance, if the electron trap layer is formed and electrons are written, the resistance between the source and drain changes vary little, even if a voltage is applied to the control gate in capacitance coupling with the electron trap layer. On the other hand, the resistance between the source and the drain dramatically increases if the voltage is controlled to the control gate in the case where the electron trap layer is not formed and thus electrons are not written. In this way, it is possible to detect where writing is effected or not, corresponding to each of the control gates, and it can be used as the memory device.

In this third embodiment, two control gates are disposed to one control region. The number of control gates may be optional depending on the case and, for example, four control gates 62, 63, 66, 67 may be disposed to one operation region 31 as shown in FIG. 22. Further, FIG. 22 is a cross-sectional view corresponding to FIG. 16 for the third embodiment, which is a partial view for the central transversal cross section of one operation region disposed in the non-volatile semiconductor memory device.

Example 4

FIGS. 23 and 24 show the vertical cross-sectional views for a portion of the non-volatile semiconductor memory device of the fourth embodiment according to this invention. The non-volatile semiconductor memory device in this embodiment has substantially an identical structure with that in the non-volatile semiconductor memory device of the third embodiment, except that oxidized film 45 is disposed between the silicon nitride layer 5 and each of the control gates 61, 62, 63, 64. The same portions in the fourth embodiment as those in the third embodiment carry the same reference numerals. The oxidized film 45 is prepared by forming the silicon nitride layer 5 and thereafter forming a SiO film at the surface of the silicon nitride layer 5 through thermal oxidation prior to the formation of the control gates 61, 62, 63, 64. Since the oxidized film 45 has a predetermined voltage withstanding insulation, electrons at the electron trap layer formed between the silicon nitride layer 5 and the tunnel oxidized film 41 can be held more reliably and the thickness of the silicon nitride layer 5 is reduced, thereby enabling an increase in the writing amount.

What is claimed is:

1. A non-volatile semiconductor memory device comprising:
   a semiconductor substrate of a first conductivity type;
   an impurity buried layer of a second conductivity type, different from said first conductivity type, formed at a surface of said semiconductor substrate, and constituting one of a drain region and a source region of a transistor of said semiconductor memory device;
   an epitaxial layer of said second conductivity type formed at a surface of said impurity buried layer;
   an insulating well extending from a surface of said epitaxial layer to said impurity buried layer, to form an independent vertical channel region coupled to said epitaxial layer;
   an impurity surface region of said second conductivity type formed at a surface of said independent vertical channel region and constituting the other of said drain region and said source region of said transistor;
   at least two electron accumulating regions formed in said insulating wall, separately facing said independent vertical channel region;
   a first insulation film between said electron accumulating regions and said insulating walls, of a thickness to cause an induced tunnel effect; and
   at least two control gate electrodes and a second insulation film, said at least two control gate electrodes extending vertically in said insulating wall, and separately facing each of said electron accumulating regions with said second insulation film therebetween, and controlling a conductivity of said independent vertical channel region between said impurity buried layer and said impurity surface region.

2. A non-volatile semiconductor memory device according to claim 1, wherein said electron accumulating region is a floating gate electrode facing one of the impurity buried layer or said drain region by way of said induced tunnel effect caused by first insulation film.

3. A non-volatile semiconductor memory device according to claim 1, comprising two pairs of said control gate electrodes and said floating gate electrode, which face each other with said independent vertical channel region therebetween.

4. A non-volatile semiconductor memory device according to claim 1, comprising four pairs of said control gate electrodes and said floating gate electrode, which are surrounding said independent vertical channel region.

5. A non-volatile semiconductor memory device according to claim 1, wherein said impurity buried layer constitutes a common drain region or a common source region of plural transistors.

6. A non-volatile semiconductor memory device according to claim 1, further comprising a third insulation film, and an electrode formed on said impurity surface region by way of said third insulation film, wherein said insulation film has a thickness to induce an induced tunnel effect.

7. A non-volatile semiconductor memory device according to claim 1, further comprising a tunnel effect silicon oxide film which is in contact with the independent vertical channel region, and a silicon nitride layer between said tunnel effect silicon oxide film and said control gate electrode, and whereby said electron accumulating region is formed at a boundary between said silicon oxide film and said silicon nitride layer.

8. A non-volatile semiconductor memory device according to claim 7, further comprising an oxide layer between the silicon nitride layer and the control gate electrode.

9. A non-volatile semiconductor memory device according to claim 7, wherein the silicon nitride layer is disposed within the insulating wall surrounding the independent vertical channel, and further comprising two control gates, facing each other with the independent vertical channel region interposed therebetween.

10. A non-volatile semiconductor memory device according to claim 7, comprising four control gate electrodes, disposed within the insulating wall surrounding the independent vertical channel region.

11. A non-volatile semiconductor memory device according to claim 7, wherein the impurity buried layer constitutes a common drain region or a common source region of plural transistors.

12. A non-volatile semiconductor memory device according to claim 7, further comprising an insulating film formed on the impurity buried layer, and an electrode formed on said insulating film wherein said insulating film is of such a thickness to cause an induced tunnel effect.

13. A non-volatile semiconductor memory device comprising:
- a semiconductor substrate of a first conductivity type;
- a impurity buried substrate of a second conductivity type different from said first conductivity type, formed at a surface of said semiconductor substrate, for constituting one of a drain region and a source region of a transistor;
- an epitaxial layer of said second conductivity type formed at a surface of said impurity buried layer;
- an insulating wall extending from a surface of said epitaxial layer to said impurity buried layer to form an independent vertical channel region as a part of said epitaxial layer;
- an impurity surface region of said second conductivity type, formed at a surface of said independent vertical channel region and constituting the other of said drain region and said source region of said transistor;
- a silicon oxide film formed on said independent vertical channel region;
- a silicon nitride layer formed in said insulating wall, which faces said independent vertical channel region on said silicon oxide film, said silicon oxide film of a thickness to cause an induced tunnel effect; and
- at least two control gate electrodes extending vertically in said insulating wall, separately facing said independent vertical channel region with said silicon nitride layer therebetween.

14. A non-volatile semiconductor memory device comprising:
- a semiconductor substrate of a first conductivity type;
- a impurity buried layer of a second conductivity type formed at a surface of said semiconductor substrate, different from said first conductivity type, for constituting one of a drain region and a source region of a transistor;
- an epitaxial layer of said second conductivity type formed at a surface of said impurity buried layer;
- an insulating wall extending from a surface of said epitaxial layer to said impurity buried layer to form an independent vertical channel region as a part of said epitaxial layer;
- an impurity surface region of said second conductivity type formed at a surface of said independent vertical channel region, constituting the other of said drain region and said source region of said transistor;
- a silicon oxide film formed on said independent vertical channel region;
- at least one electron accumulating region, facing said independent vertical channel region;
- a first insulation film between said electron accumulating region and said insulating walls, of a thickness to cause an induced tunnel effect;
- a second insulation film; and
- at least one control gate electrode extending vertically in said insulating wall, and facing said electron accumulating region with said second insulation film therebetween, and controlling a conductivity between said impurity buried layer and said impurity surface region.

* * * * *